United States Patent
Ariyama

(10) Patent No.: US 10,852,328 B2
(45) Date of Patent: Dec. 1, 2020

(54) ZERO-CROSSING DETECTION CIRCUIT AND SENSOR DEVICE

(71) Applicant: ABLIC INC., Chiba (JP)

(72) Inventor: Minoru Ariyama, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/717,820

(22) Filed: Dec. 17, 2019

(65) Prior Publication Data
US 2020/0124647 A1    Apr. 23, 2020

Related U.S. Application Data

(63) Continuation of application No. 15/598,755, filed on May 18, 2017, now abandoned.

(30) Foreign Application Priority Data

May 20, 2016  (JP) .................................. 2016-101236
Mar. 24, 2017  (JP) .................................. 2017-059973

(51) Int. Cl.
*G01R 19/00* (2006.01)
*G01R 19/17* (2006.01)
(Continued)

(52) U.S. Cl.
CPC ............. *G01R 19/175* (2013.01); *G01D 3/10* (2013.01); *G01D 5/12* (2013.01); *G01R 31/343* (2013.01)

(58) Field of Classification Search
CPC ...... G01R 19/00; G01R 19/17; G01R 19/175; G01R 29/00; G01R 17/02; G01D 5/12; G01D 5/2448; G01D 3/10; H03K 5/22
See application file for complete search history.

(56) References Cited

U.S. PATENT DOCUMENTS 4,959,558 A    9/1990   Kay
5,949,597 A    9/1999   Pahr
(Continued)

FOREIGN PATENT DOCUMENTS

JP    63-075670 A      4/1988
JP    H10-093402       4/1998
(Continued)

OTHER PUBLICATIONS

Notice of Reasons for Refusal issued in corresponding Japanese Application No. JP2017-059973 dated Jul. 4, 2019 (In Japanese (2 pages) and English Translation (2 pages)).

*Primary Examiner* — Neel D Shah
(74) *Attorney, Agent, or Firm* — Brinks Gilson & Lione

(57) ABSTRACT

Provided is a zero-crossing detection circuit capable of detecting zero-crossing with high accuracy without being influenced by noise. The zero-crossing detection circuit includes a first comparison circuit, a second comparison circuit having a hysteresis function, and a logic circuit. The first comparison circuit is configured to output a zero-crossing detection result of a first input signal and a second input signal. The second comparison circuit is configured to output a comparison result of the first input signal and the second input signal. The logic circuit includes a unit configured to determine whether to reflect the zero-crossing detection result to output of the logic circuit based on the zero-crossing detection result and the comparison result.

7 Claims, 7 Drawing Sheets

(51) Int. Cl.
  G01R 29/00  (2006.01)
  G01R 17/02  (2006.01)
  H03K 5/22  (2006.01)
  G01R 19/175  (2006.01)
  G01D 3/10  (2006.01)
  G01D 5/12  (2006.01)
  G01R 31/34  (2020.01)

(56) References Cited

U.S. PATENT DOCUMENTS

| | | |
|---|---|---|
| 6,326,816 B1 | 12/2001 | Su |
| 2011/0057686 A1* | 3/2011 | Ueda .................. H03K 5/08 |
| | | 327/65 |
| 2011/0062996 A1* | 3/2011 | Chang .................. G01R 17/02 |
| | | 327/77 |
| 2012/0039425 A1 | 2/2012 | Wang |
| 2012/0242264 A1 | 9/2012 | Satake et al. |
| 2016/0141887 A1 | 5/2016 | Xue |

FOREIGN PATENT DOCUMENTS

| | | |
|---|---|---|
| JP | H11248761 A | 9/1999 |
| JP | 2004-012168 | 1/2004 |
| JP | 2011-220953 A | 11/2011 |

* cited by examiner

FIG. 1
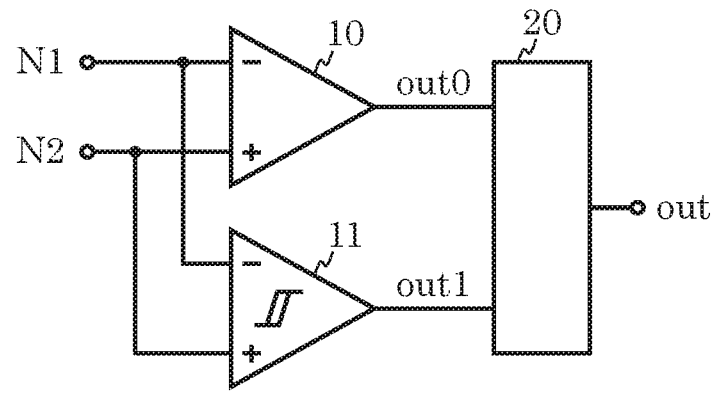
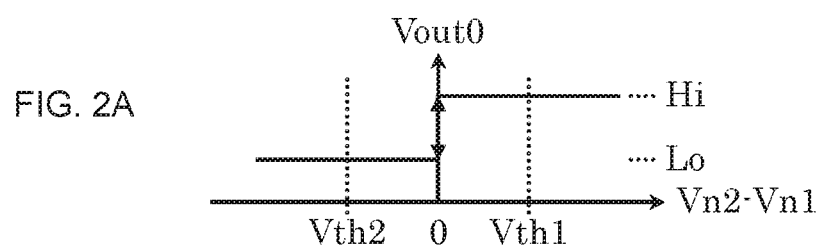
FIG. 2A
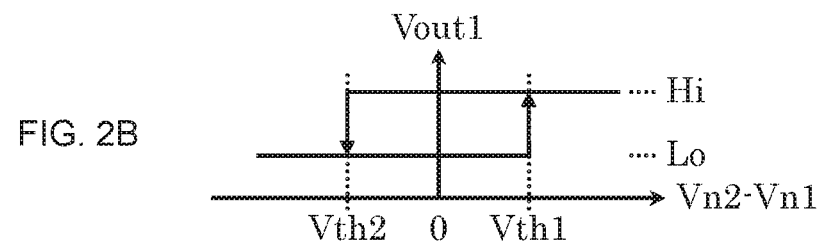
FIG. 2B
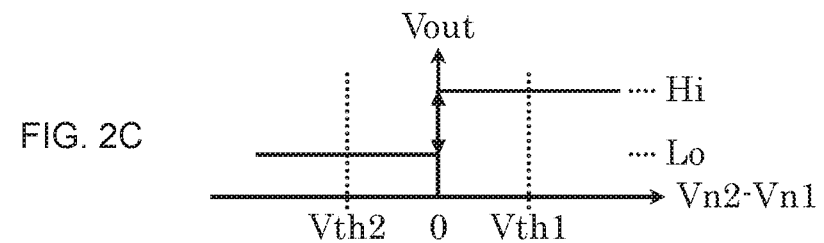
FIG. 2C

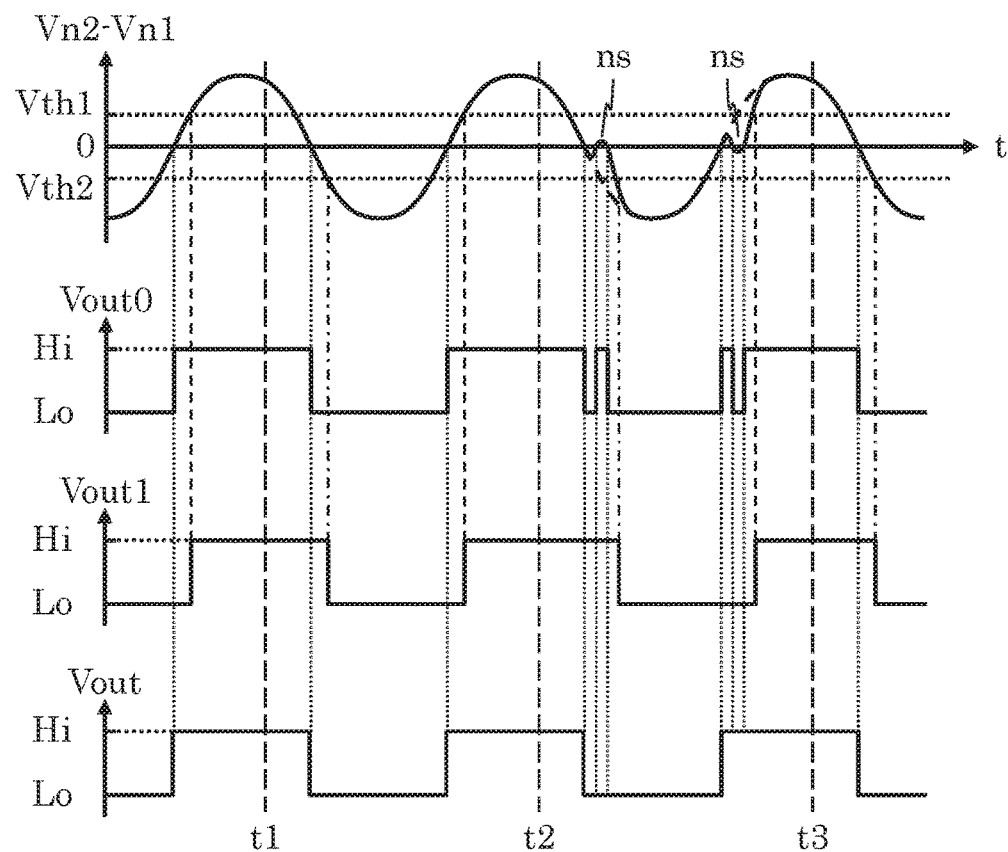
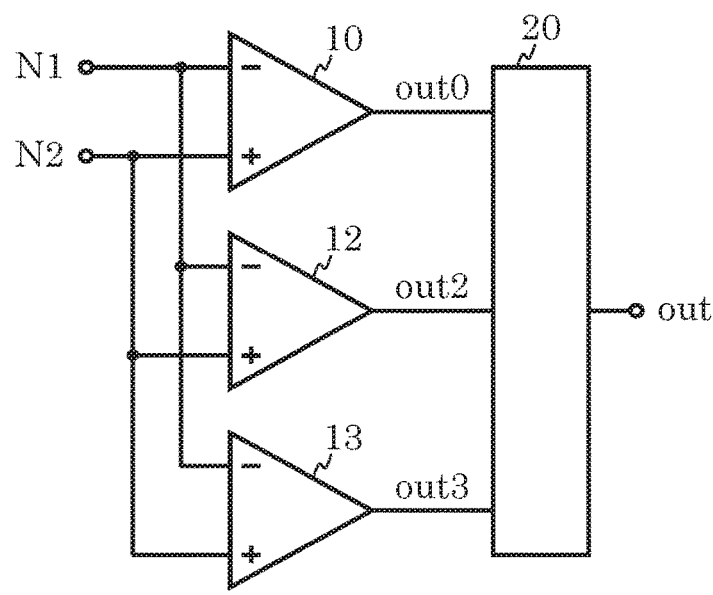

ZERO-CROSSING DETECTION CIRCUIT AND SENSOR DEVICE

RELATED APPLICATIONS

This application is a divisional application of U.S. application Ser. No. 15/598,755, filed May 18, 2017, which claims priority under 35 U.S.C. § 119 to Japanese Patent Applications No. 2016-101236 filed on May 20, 2016 and No. 2017-059973 filed on Mar. 24, 2017. The entire content of each of the above applications is hereby incorporated by reference.

BACKGROUND OF THE INVENTION

1. Field of the Invention

The present invention relates to a zero-crossing detection circuit and a sensor device, and more particularly, to a zero-crossing detection circuit capable of accurately detecting a zero-crossing point based on a signal from a sensor element.

2. Description of the Related Art

Hitherto, various sensor devices have been mounted on electronic devices to be utilized. As an example, a magnetic sensor device is used for detecting a position of a movable element of a brushless motor. The brushless motor includes a cylindrical stator, and a cylindrical rotor provided so as to be opposed to an inner periphery or an outer periphery of the stator. The rotor is configured to freely rotate about its rotary axis with respect to the stator. The rotor includes field magnets arranged along a circumferential direction of the rotor, and the stator includes a stator core having winding wound therearound. A magnetic field generated by causing current to flow through the winding and a magnetic field generated by the field magnets interact with each other to cause rotation of the rotor.

In order to control the rotation of the rotor, it is necessary to detect a rotational position of the rotor, and a magnetic sensor element is generally used as means for detecting the position. The magnetic sensor element is configured to detect the rotational position of the rotor by detecting a position at which the S-pole and the N-pole of the magnet are switched, that is, a zero-crossing position. As for zero-crossing detection, there have been examined various methods using hysteresis characteristics to prevent chattering near the zero-crossing. However, this hysteresis may cause deviation between an original zero-crossing position and a zero-crossing detection position detected based on a sensor signal, which may cause problems such as reduction in motor efficiency, rotation unevenness, and occurrence of vibration. Thus, there has been required a zero-crossing detection circuit capable of preventing chattering near the zero-crossing with no hysteresis characteristics in its output.

FIG. 12 is a circuit diagram for illustrating an example of a related-art zero-crossing detection circuit. The related-art zero-crossing detection circuit includes an operational amplifier 50 and a comparison signal generation circuit 51. The operational amplifier 50 is configured to receive a signal S to be detected at an inverting input terminal as input, to thereby output a zero-crossing detection signal fa. The comparison signal generation circuit 51 is configured to generate a comparison signal h to apply the comparison signal h to a non-inverting input terminal of the operational amplifier 50. The comparison signal h is inverted to the positive or negative level with respect to the signal S to be detected based on the zero-crossing detection signal fa immediately after the zero-crossing detection, and sequentially changes its level to reach a zero level after a predetermined time period. The comparison signal generation circuit 51 includes resistors R10 and R11 and a capacitor Ca, and a time constant $T=(R10+R11) \cdot Ca$ is set.

FIG. 13 is an illustration of the operation of the related-art zero-crossing detection circuit configured as described above. When the signal S to be detected is applied to the inverting input terminal of the operational amplifier 50, the operational amplifier 50 compares the respective levels of the signal S to be detected and the comparison signal h to output the zero-crossing detection signal fa being the result of this comparison. At a time t1, the signal S to be detected has a positive level, and the comparison signal h has a negative level. Thus, the operational amplifier 50 outputs a low-level zero-crossing detection signal fa. As time elapses from this state, the level of the comparison signal h changes in accordance with the time constant T to reach the zero level. When the signal S to be detected crosses zero at a time t2, the voltage at the inverting input terminal of the operational amplifier 50 changes from the positive level to the zero level, and further changes to the negative level. This causes the zero-crossing detection signal fa output from the operational amplifier 50 to be inverted to the high level at the time t2. At this time, a high-level zero-crossing detection signal fa, that is, +Vdd is applied to the capacitor Ca, and hence a voltage C of +2Vdd appears at the other end of the capacitor Ca. This voltage C is divided by the resistors R10 and R11 to be supplied to the non-inverting input terminal of the operational amplifier 50 as the comparison signal h. Thus, immediately after the time t2, the signal S to be detected changed to the negative level and the comparison signal h changed to the positive level are compared to each other by the operational amplifier 50. With this, even when noise ns is added to the signal S to be detected near zero-crossing to forcibly cause the zero-crossing, the zero-crossing detection circuit operates such that the positive or negative level of the comparison signal h is inverted with respect to the signal S to be detected due to the action of the comparison signal generation circuit 51. Thus, the zero-crossing detection signal fa output from the operational amplifier 50 is prevented from being inverted due to the noise ns, and thus a detection error of the zero-crossing is prevented. After that, the level of the comparison signal h gradually degreases in accordance with the time constant T, and reaches the zero level before a next zero-crossing time t3. When the signal S to be detected crosses zero again at the time t3, the zero-crossing detection signal fa output from the operational amplifier 50 is inverted to have a low level. At this time, a low-level zero-crossing detection signal fa, that is, a voltage −Vdd is applied to the capacitor Ca, and hence the voltage C of −2Vdd appears at the other end of the capacitor Ca. This voltage C is divided by the resistors R10 and R11 to be supplied to the non-inverting input terminal of the operational amplifier 50 as the comparison signal h. The above-mentioned operation is performed for each change in positive and negative levels of the signal to be detected so as to output the zero-crossing detection signal fa. Thus, the zero-crossing detection signal is achieved without a detection error, that is, chattering, even when zero-crossing is caused due to noise.

SUMMARY OF THE INVENTION

In order to be able to detect the zero-crossing point with high accuracy, a zero-crossing detection circuit according to the present invention is configured as follows.

The zero-crossing detection circuit includes a first comparison circuit configured to receive a first input signal and a second input signal as input, a second comparison circuit having a hysteresis function and being configured to receive the first input signal and the second input signal as input, and a logic circuit. The first comparison circuit is configured to output a zero-crossing detection result of the first input signal and the second input signal. The second comparison circuit is configured to output a comparison result of the first input signal and the second input signal. The logic circuit includes means for determining output of the logic circuit based on the zero-crossing detection result and the comparison result.

According to the zero-crossing detection circuit of the present invention, the zero-crossing point at which the input signal is switched from positive to negative or from negative to positive can be detected with high accuracy, and the influence of zero-crossing due to noise can be removed. In addition, the zero-crossing detection circuit can be achieved with a relatively small circuit scale and a simple configuration. The present invention is widely applicable not only to a brushless motor given as an example but also to general zero-crossing point detection of signals such as sensor output.

BRIEF DESCRIPTION OF THE DRAWINGS

FIG. 1 is a circuit diagram for illustrating a zero-crossing detection circuit according to a first embodiment of the present invention.

FIG. 2A, FIG. 2B, and FIG. 2C are graphs for showing an operation of each element of the zero-crossing detection circuit according to the first embodiment.

FIG. 3A, FIG. 3B, FIG. 3C, and FIG. 3D are charts for illustrating an operation of the zero-crossing detection circuit according to the first embodiment.

FIG. 4 is another example of the zero-crossing detection circuit according to the first embodiment.

DETAILED DESCRIPTION OF THE PREFERRED EMBODIMENTS

Figure 5A:
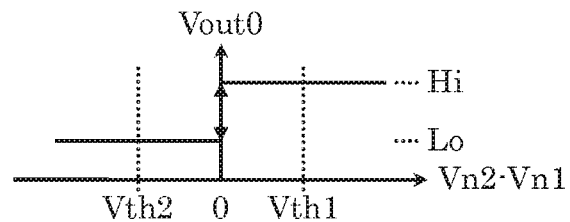
FIG. 5A, FIG. 5B, FIG. 5C, and FIG. 5D are graphs for showing an operation of each element of the another example of the zero-crossing detection circuit according to the first embodiment.

A zero-crossing detection circuit according to the present invention may be widely used as a zero-crossing detection circuit in a semiconductor circuit. Now, the zero-crossing detection circuit according to the present invention is described with reference to the drawings.

First Embodiment

FIG. 1 is a circuit diagram for illustrating a zero-crossing detection circuit according to a first embodiment of the present invention. The zero-crossing detection circuit according to the first embodiment includes a comparison circuit 10, a comparison circuit 11, and a logic circuit 20.

The comparison circuit 10 includes two input terminals and one output terminal, specifically, an inverting input terminal, a non-inverting input terminal, and an output terminal out0. Further, the comparison circuit 11 includes two input terminals and one output terminal, specifically, an inverting input terminal, a non-inverting input terminal, and an output terminal out1. The inverting input terminal of the comparison circuit 10 and the inverting input terminal of the comparison circuit 11 are connected in common to an input terminal N1. The non-inverting input terminal of the comparison circuit 10 and the non-inverting input terminal of the comparison circuit 11 are connected in common to an input terminal N2. A first input signal and a second input signal are supplied to the input terminal N1 and the input terminal N2, respectively. The output terminal out0 of the comparison circuit 10 and the output terminal out1 of the comparison circuit 11 are connected to the logic circuit 20. The logic circuit 20 is configured to receive a signal from the output terminal out0 and a signal from the output terminal out1 as input, to thereby output a logical operation result from an output terminal out. In the following description, the voltage of the input terminal N1, the voltage of the input terminal N2, the voltage of the output terminal out0, the voltage of the output terminal out1, and the voltage of the output terminal out are referred to as an input voltage Vn1, an input voltage Vn2, an output voltage Vout0, an output voltage Vout1, and an output voltage Vout, respectively.

Next, the operation of the zero-crossing detection circuit according to the first embodiment is described with reference to FIG. 2A to FIG. 2C and FIG. 3A to FIG. 3D.

First, the operation of the comparison circuit 10 is described. The comparison circuit 10 operates so as to output a high level from the output terminal out0 when the voltage supplied to the non-inverting input terminal is higher than the voltage supplied to the inverting input terminal, and, on the other hand, output a low level from the output terminal out0 when the voltage supplied to the non-inverting input terminal is lower than the voltage supplied to the inverting input terminal. The details of the operation are shown in FIG. 2A. In FIG. 2A, the lateral axis represents an input voltage difference between the input voltages Vn1 and Vn2, and the vertical axis represents each output voltage. As shown in FIG. 2A, when the input voltage Vn2 is higher than the input voltage Vn1, that is, when Vn2−Vn1>0 is satisfied, the output voltage Vout0 is output as a high level. On the other hand, when the input voltage Vn2 is lower than the input voltage Vn1, that is, when Vn2−Vn1<0 is satisfied, the output voltage Vout0 is output as a low level. The output voltage Vout0 transitions from the high level to the low level when Vn2−Vn1=0 is satisfied. Further, the output voltage Vout0 similarly transitions from the low level to the high level when Vn2−Vn1=0 is satisfied.

Further, the operation of the comparison circuit 10 when the input voltage difference Vn2−Vn1 changes along with time is illustrated in FIG. 3A and FIG. 3B. In FIG. 3A and FIG. 3B, the lateral axis represents elapse of time, and the vertical axis represents the input voltage difference or the output voltage. FIG. 3A represents transition of the input voltage difference Vn2−Vn1 that changes along with time. The input voltage difference Vn2−Vn1 may take various values along with the time change. In particular, the time when Vn2−Vn1=0 is satisfied is expressed as zero-crossing. FIG. 3B represents transition of the output voltage Vout0 that changes along with the time change of the input voltage difference Vn2−Vn1. As illustrated in FIG. 3B, the output voltage Vout0 is output as a high level when Vn2−Vn1>0 is satisfied, and is output as a low level when Vn2−Vn1<0 is satisfied. When Vn2−Vn1=0 is satisfied, that is, when Vn1=Vn2 is satisfied, the output voltage Vout0 is detected as zero-crossing.

Next, the operation of the comparison circuit 11 is described. The comparison circuit 11 operates so as to output a high level from the output terminal out1 when the voltage supplied to the non-inverting input terminal is higher than a sum of the voltage supplied to the inverting input terminal and a voltage Vth1, and, on the other hand, output a low level from the output terminal out1 when the voltage supplied to the non-inverting input terminal is lower than a sum of the voltage supplied to the inverting input terminal and a voltage Vth2. The details of this operation are shown in FIG. 2B. As shown in FIG. 2B, the output voltage Vout1 is output as a high level when the input voltage Vn2 is higher than the sum of the input voltage Vn1 and the voltage Vth1, that is, when Vn2−Vn1>Vth1 is satisfied, and is output as a low level when the input voltage Vn2 is lower than the sum of the input voltage Vn1 and the voltage Vth2, that is, when Vn2−Vn1<Vth2 is satisfied. In this case, the voltage Vth1 is a positive value and represents a positive hysteresis value, and the voltage Vth2 is a negative value and represents a negative hysteresis value. The output voltage Vout1 transitions from the high level to the low level when Vn2−Vn1=Vth2 is satisfied. Further, the output voltage Vout1 transitions from the low level to the high level when Vn2−Vn1=Vth1 is satisfied. When Vn2−Vn1 falls within a range between Vth1 and Vth2, the high level or the low level is output depending on the latest state. That is, the comparison circuit 11 operates as a comparison circuit having a hysteresis width of |Vth1|+|Vth2|.

Further, the operation of the comparison circuit 11 when the input voltage difference Vn2−Vn1 changes along with time is illustrated in FIG. 3A and FIG. 3C. FIG. 3C represents transition of the output voltage Vout1 that changes along with the time change of the input voltage difference Vn2−Vn1 illustrated in FIG. 3A. At a time t1, that is, when Vn2−Vn1>Vth1 is satisfied, the output voltage Vout1 is output as a high level. Even after elapse of time thereafter, the output voltage Vout1 is maintained at the high level, and then transitions from the high level to the low level when Vn2−Vn1<Vth2 is satisfied along with the decrease of Vn2−Vn1. Even after elapse of time thereafter, the output voltage Vout1 is maintained at the low level, and then transitions from the low level to the high level when Vn2−Vn1>Vth1 is satisfied along with the increase of Vn2−Vn1.

Next, the operation of the logic circuit 20 is described. The logic circuit 20 operates so as to determine the logic of the output voltage Vout depending on the logic states of the output voltage Vout0 and the output voltage Vout1. In more detail, when Vout1 is at a high level, the logic circuit 20 causes Vout to transition from the high level to the low level based on the transition of Vout0 from the high level to the low level. When Vout is originally at the low level, Vout does not change. The transition of Vout0 from the low level to the high level does not cause Vout to change. Further, when Vout1 is at a low level, the transition of Vout0 from the low level to the high level causes Vout to transition from the low level to the high level. When Vout is originally at the high level, Vout does not change. The transition of Vout0 from the high level to the low level does not cause Vout to change. The above-mentioned operation is described with reference to FIG. 3A to FIG. 3D.

As described above, FIG. 3A, FIG. 3B, and FIG. 3C represent the time change of the input voltage difference Vn2−Vn1, the time change of the output voltage Vout0, and the time change of the output voltage Vout1, respectively. FIG. 3D represents the time change of the output voltage Vout.

In FIG. 3A to FIG. 3D, at the time t1, the output voltage Vout0 and the output voltage Vout1 are at a high level. After that, as the time elapses and Vn2−Vn1 decreases, Vout0 transitions from the high level to the low level when zero-crossing is obtained. At this time, Vout1 is at a high level, and hence the logic circuit 20 outputs, to Vout, the detection of zero-crossing from the high level to the low level based on Vout0. After that, as the time elapses and Vn2−Vn1<Vth2 is satisfied, Vout1 transitions from the high level to the low level. After that, as the time elapses and Vn2−Vn1 increases, Vout0 transitions from the low level to the high level when zero-crossing is obtained. At this time, Vout1 is at the low level, and hence the logic circuit 20 outputs, to Vout, the detection of the zero-crossing from the low level to the high level based on Vout0. After that, as the time elapses and Vn2−Vn1>Vth1 is satisfied, Vout1 transitions from the low level to the high level. Further after that, as the time elapses to arrive at a time t2, the same state as that at the time t1 is obtained.

At the time t2, the output voltage Vout0 and the output voltage Vout1 are at a high level. After that, as the time elapses and Vn2−Vn1 decreases, Vout0 transitions from the high level to the low level when zero-crossing is obtained. At this time, Vout1 is at a high level, and hence the logic circuit 20 outputs, to Vout, the detection of the zero-crossing from the high level to the low level based on Vout0. Then, as the time elapses, Vn2−Vn1 crosses zero two times due to the noise ns. Thus, the output voltage Vout0 transitions from the low level to the high level, and then further transitions to the low level. At this time, Vout1 is at a high level, and hence the logic circuit 20 operates so as to prevent the transition from the low level to the high level of Vout0 from being output to Vout. Thus, the zero-crossing detection due to the noise does not appear at the output terminal out. As the time further elapses and Vn2−Vn1<Vth2 is satisfied, Vout1 transitions from the high level to the low level. After that, as the time elapses and Vn2−Vn1 increases, Vout0 transitions from the low level to the high level when zero-crossing is obtained. At this time, Vout1 is at a low level, and hence the logic circuit 20 outputs, to Vout, the detection of the zero-crossing from the low level to the high level based on Vout0. After that, as the time elapses, Vn2−Vn1 crosses zero two times due to the noise ns. Thus, the output voltage Vout0 transitions from the high level to the low level, and then further transitions to the high level. At this time, Vout1 is at a low level, and hence the logic circuit 20 operates so as to prevent the transition from the high level to the low level of Vout0 from being output to Vout. Thus, the zero-crossing detection due to the noise does not appear at the output terminal out. After that, as the time elapses and Vn2−Vn1>Vth1 is satisfied, Vout1 transitions from the low level to the high level. Further after that, as the time elapses to arrive at a time t3, the same state as those at the time t1 and the time 2 is obtained.

Description has been given above of the operation of the zero-crossing detection circuit according to the first embodiment. It is shown that zero-crossing detection can be performed while removing the influence of zero-crossing due to noise, and also zero-crossing detection results can be obtained with high accuracy with a simple circuit configuration. With use of the zero-crossing detection circuit according to the first embodiment in a brushless motor, the demand for high-speed rotation can be met. Further, an output error due to noise, which has been a problem in the related art when meeting the demand of increase in speed, can be prevented, and the rotation can be controlled accurately.

Figure 5B:
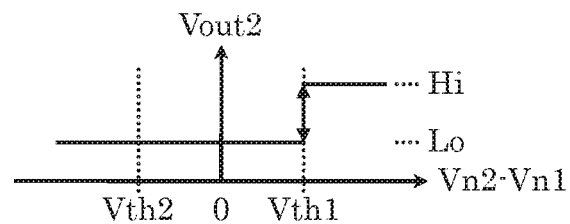
Figure 5C:
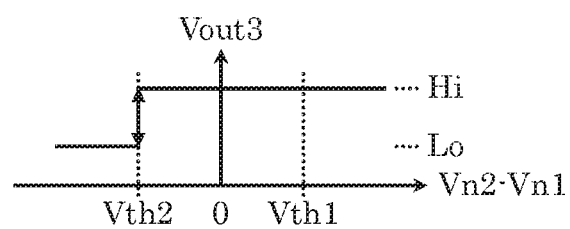
Figure 5D:
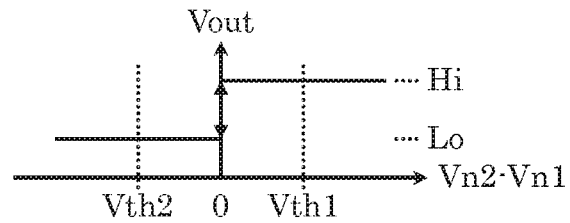

In this description, the voltage Vth1 and the voltage Vth2 are regarded as the hysteresis voltages of the comparison circuit 11, but as illustrated in the circuit diagram of FIG. 4 and the operation graphs of FIG. 5A to FIG. 5D, the comparison circuit 11 may be divided into a comparison circuit 12 and a comparison circuit 13. The comparison circuit 12 may determine whether Vn2−Vn1 is larger or smaller than the voltage Vth1, and the comparison circuit 13 may determine whether Vn2−Vn1 is larger or smaller than the voltage Vth2. Here, FIG. 5A represents the operation of the comparison circuit 10, FIG. 5B represents the operation of the comparison circuit 12, FIG. 5C represents the operation of the comparison circuit 13, and FIG. 5D represents the operation of the logic circuit 20.

Second Embodiment

Figure 6:
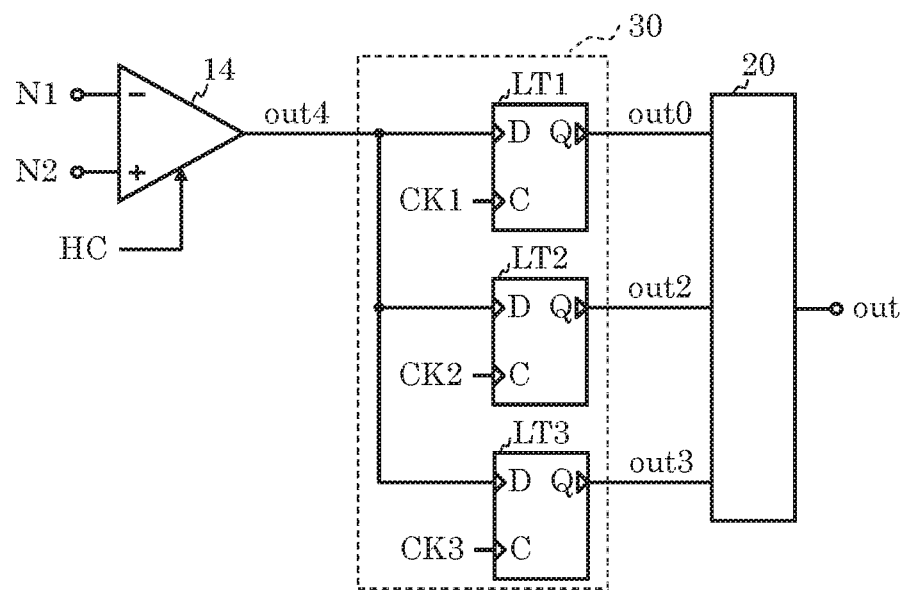
FIG. 6 is a circuit diagram for illustrating a zero-crossing detection circuit according to a second embodiment of the present invention.

FIG. 6 is a circuit diagram for illustrating a zero-crossing detection circuit according to a second embodiment of the present invention. The second embodiment differs from the first embodiment illustrated in FIG. 1 in that the comparison circuit 10 and the comparison circuit 11 are removed to add a comparison circuit 14, and a latch circuit 30 is added between the comparison circuit 14 and the logic circuit 20. The added elements are configured and connected as follows. Further, the following connection differs from that of the first embodiment due to the removed elements.

The comparison circuit 14 includes two input terminals, one output terminal, and one control terminal HC. Specifically, the comparison circuit 14 includes an inverting input terminal, a non-inverting input terminal, an output terminal out4, and a hysteresis control terminal HC. The inverting input terminal of the comparison circuit 14 is connected to the input terminal N1, and the non-inverting input terminal of the comparison circuit 14 is connected to the input terminal N2. The hysteresis control terminal HC of the comparison circuit 14 is configured to adjust a hysteresis voltage of the comparison circuit 14 based on a control signal input to the hysteresis control terminal. The control circuit for the hysteresis control terminal HC is not shown. The output terminal out4 of the comparison circuit 14 is connected to the latch circuit 30. The latch circuit 30 includes latches LT1, LT2, and LT3, and the output terminal out4 is connected to data input terminals D of the latches LT1, LT2, and LT3. A data output terminal Q of the latch LT1, a data output terminal Q of the latch LT2, and a data output terminal Q of the latch LT3 correspond to the output terminal out0, the output terminal out2, and the output terminal out3, respectively, which are connected to the logic circuit 20 similarly to the first embodiment illustrated in FIG. 4. The latches LT1, LT2, and LT3 each include a clock terminal C, and are each configured to latch data input to the data input terminal D based on each of clock signals CK1, CK2, and CK3 to output the data to the data output terminal Q. The control circuit for the clock signals CK1, CK2, and CK3 is not shown. Other connections and configurations are the same as those of the first embodiment. In the following description, the voltage of the output terminal out4 is referred to as an output voltage Vout4.

Next, the operation of the zero-crossing detection circuit according to the second embodiment is described.

The comparison circuit 14 operates so as to perform the operations of the comparison circuit 10 and the comparison circuit 11 of the first embodiment in a time-division manner based on the control signal input to the hysteresis control terminal HC. That is, when the comparison circuit 14 is controlled so that the voltage Vth1 and the voltage Vth2 are zero, the comparison circuit 14 operates similarly to the comparison circuit 10, and when the comparison circuit 14 is controlled so that the voltage Vth1 and the voltage Vth2 are prevented from being zero, the comparison circuit 14 operates similarly to the comparison circuit 12 or the comparison circuit 13. The comparison circuit that operates as described above can be obtained by a known technology, and hence description thereof is omitted herein. When the output voltage Vout4 of the comparison circuit 14 is latched by the latch LT1 based on the clock signal CK1 under a state in which the comparison circuit 14 is controlled in the same manner as the comparison circuit 10, the output voltage Vout0 becomes an output voltage similar to Vout0 represented in FIG. 5A and FIG. 3B. When the output voltage Vout4 of the comparison circuit 14 is latched by the latches LT2 and LT3 based on the clock signals CK2 and CK3 under a state in which the comparison circuit 14 is controlled in the same manner as the comparison circuit 12 and the comparison circuit 13, the output voltage Vout1 becomes an output voltage similar to Vout1 represented in FIG. 5B, FIG. 5C, and FIG. 3C. The operation of the logic circuit 20 is similar to that of the first embodiment, and the output voltage Vout can be used to perform zero-crossing detection while removing the influence of zero-crossing due to noise.

In the second embodiment, the comparison circuit 14 is operated in a time-division manner, and hence the operation speed is lower than that of the first embodiment. However, the second embodiment has an advantage in that the number of the comparison circuits can be reduced to decrease the circuit scale.

Description has been given above of the operation of the zero-crossing detection circuit according to the second embodiment. Similarly to the first embodiment, it is shown that zero-crossing detection can be performed while removing the influence of zero-crossing due to noise, and zero-crossing detection results can be obtained with high accuracy with a simple circuit configuration.

Third Embodiment

Figure 7:
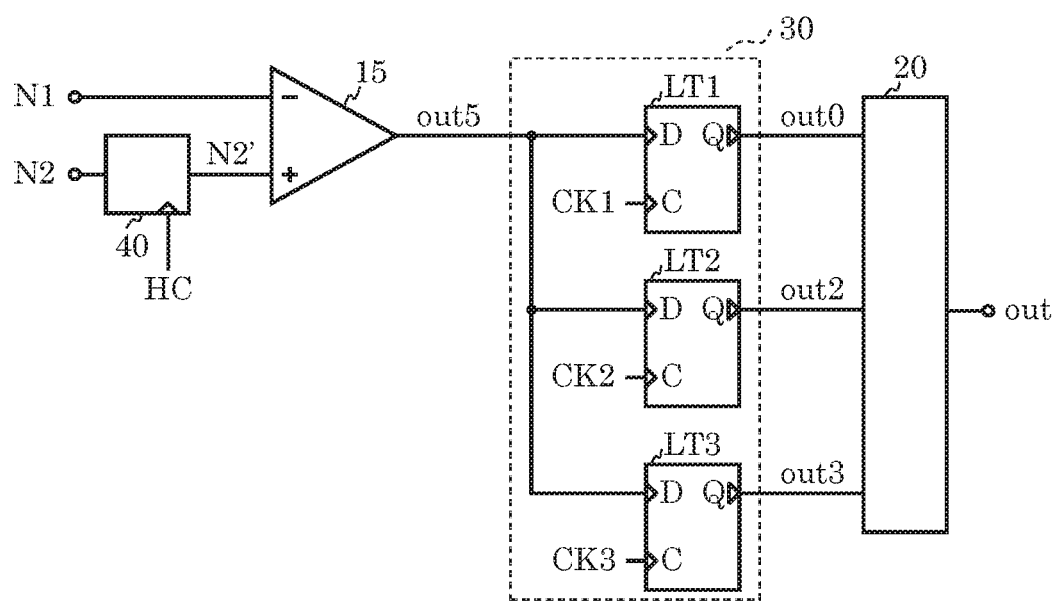
FIG. 7 is a circuit diagram for illustrating a zero-crossing detection circuit according to a third embodiment of the present invention.

FIG. 7 is a circuit diagram for illustrating a zero-crossing detection circuit according to a third embodiment of the present invention. The third embodiment differs from the second embodiment illustrated in FIG. 6 in that the comparison circuit 14 is removed to add a comparison circuit 15, and a hysteresis generation circuit 40 is added between the input terminal N2 and a non-inverting input terminal of the comparison circuit 15. The added elements are configured and connected as follows. Further, the following connection differs from that of the second embodiment due to the removed element.

The comparison circuit 15 includes two input terminals and one output terminal. Specifically, the comparison circuit 15 includes an inverting input terminal, the non-inverting input terminal, and an output terminal out5. The inverting input terminal of the comparison circuit 15 is connected to the input terminal N1, and the non-inverting input terminal of the comparison circuit 15 is connected to an output terminal of the hysteresis generation circuit 40. An input terminal of the hysteresis generation circuit 40 is connected to the input terminal N2. The output terminal out5 of the comparison circuit 15 is connected to the latch circuit 30. The hysteresis generation circuit 40 includes the hysteresis control terminal HC, and is configured to adjust a hysteresis voltage based on a control signal. The control circuit for the hysteresis control terminal HC is not shown. Other connections and configurations are similar to those of the second embodiment. In the following description, the node between the non-inverting input terminal of the comparison circuit 15 and the output terminal of the hysteresis generation circuit 40 is represented by N2', and the voltage of the node N2' is represented by Vn2'. Further, the voltage of the output terminal out5 is referred to as an output voltage Vout5.

Next, the operation of the zero-crossing detection circuit according to the third embodiment is described.

The comparison circuit 15 operates similarly to the comparison circuit 10 of the first embodiment. That is, the comparison circuit 15 operates so as to output a high level from the output terminal out5 when the voltage supplied to the non-inverting input terminal is higher than the voltage supplied to the inverting input terminal, and, on the other hand, output a low level from the output terminal out5 when the voltage supplied to the non-inverting input terminal is lower than the voltage supplied to the inverting input terminal. The hysteresis generation circuit 40 operates so as to switch whether to output the input voltage as it is, output the input voltage with the positive voltage Vth1 being added, or output the input voltage with the negative voltage Vth2 being added, depending on the control state of the hysteresis control terminal HC. That is, the output voltage of the hysteresis generation circuit 40 is controlled so as to satisfy any one of Vn2'=Vn2, Vn2'=Vn2+Vth1, and Vn2'=Vn2+Vth2. The hysteresis generation circuit that operates as described above can be obtained by a known technology, and, for example, can be achieved with use of a resistor, a constant current source, and a switching element.

Under a state in which the output voltage of the hysteresis generation circuit 40 is controlled so as to satisfy Vn2'=Vn2, the comparison circuit 15 compares the voltage Vn2'=Vn2 input to the non-inverting input terminal and the voltage Vn1 input to the inverting input terminal. Thus, the comparison circuit 15 operates similarly to the comparison circuit 10 of the first embodiment. When the output voltage Vout5 of the comparison circuit 15 is latched by the latch LT1 based on the clock signal CK1 under this control state, the output voltage Vout0 becomes an output voltage similar to Vout0 represented in FIG. 5A and FIG. 3B.

Further, under a state in which the output voltage of the hysteresis generation circuit 40 is controlled so as to satisfy Vn2'=Vn2+Vth1, the comparison circuit 15 compares the voltage Vn2'=Vn2+Vth1 input to the non-inverting input terminal and the voltage Vn1 input to the inverting input terminal. Under a state in which the output voltage of the hysteresis generation circuit 40 is controlled so as to satisfy Vn2'=Vn2+Vth2, the comparison circuit 15 compares the voltage Vn2'=Vn2+Vth2 input to the non-inverting input terminal and the voltage Vn1 input to the inverting input terminal. Thus, the comparison circuit 15 operates similarly to the comparison circuits 12 and 13 of the first embodiment. When the output voltage Vout5 of the comparison circuit 15 is latched by the latches LT2 and LT3 based on the clock signals CK2 and CK3 under those control states, the output voltage Vout1 becomes an output voltage similar to Vout1 represented in FIG. 5B, FIG. 5C, and FIG. 3C. The operation of the logic circuit 20 is similar to those in the first and second embodiments, and the output voltage Vout can be used to perform zero-crossing detection while removing the influence of zero-crossing due to noise.

In the third embodiment, the hysteresis generation circuit 40 is operated in a switching manner, and hence the operation speed is lower than that of the first embodiment as in the second embodiment. However, the third embodiment has an advantage in that the number of the comparison circuits can be reduced to decrease the circuit scale.

Description has been given above of the operation of the zero-crossing detection circuit according to the third embodiment. Similarly to the first and second embodiments, it is shown that zero-crossing detection can be performed while removing the influence of zero-crossing due to noise, and zero-crossing detection results can be obtained with high accuracy with a simple circuit configuration.

In this description, for the sake of convenience in description, the voltage is added to the input terminal N2 side, but the voltage may be added to the input terminal N1 side. Further, the voltage may be added to both of the input terminal N1 and the input terminal N2.

Further, in the description of the second and third embodiments, the latch circuit is represented as a circuit configured to hold the output voltage of the comparison circuit, but the present invention is not necessarily limited to this configuration as long as the configuration can perform a data importing operation.

Further, in the description of the first, second, and third embodiments, description is given of the operation of selecting whether or not to output the output voltage Vout0 to the voltage Vout depending on the high-level or low-level logic state of the output voltage Vout1, but the present invention is not necessarily limited thereto. There may be performed an operation of controlling the output voltage Vout at a timing at which the output Vout0 changes based on the logic state of the output voltage Vout1. Further, there may be performed an operation of outputting, to Vout, the transition from the high level to the low level of Vout0 only once when the output voltage Vout1 is at a high level, and outputting, to Vout, the transition from the low level to the high level of Vout0 only once when the output voltage Vout1 is at a low level. Further, for the sake of convenience in description, the high level and the low level of each output voltage is specified based on the operation state, but the high level and the low level may be reversed, and the combination of the high level and the low level may be changed. Further, in this description, the voltage Vth1 and the voltage Vth2 are regarded as the hysteresis voltages of the comparison circuit. However, the present invention is not necessarily limited to this configuration as long as the configuration can perform the operation of the comparison circuit described herein. As an example, the comparison circuit may not have the hysteresis voltages therein. A reference voltage may be supplied to the comparison circuit to adjust the inverting level of the output voltage Vout1. Further, the voltage Vth1 and the voltage Vth2 are regarded as constant voltages that do not change along with time as illustrated in FIG. 3A. However, for example, when the magnitude of the noise changes depending on a power supply voltage or an ambient environment like temperature, the voltage Vth1 and the voltage Vth2 may be variable instead of being constant voltages. Further, the hysteresis width of the comparison circuit 10 is not particularly referred to, and the description is made on the premise that the hysteresis width is zero. In an actual circuit, however, a non-ideal component is present, and hence the hysteresis width is not always zero and may have a minute value. Even in this case, the effect of the present invention is not lost. Further, in an actual circuit, the comparison circuit 10 may have a hysteresis function with very small amplitude in order to remove the noise due to, for example, fluctuations in power supply voltage. Alternatively, the comparison circuit 10 may have a temporal hysteresis function, or a digital filter may be provided by sampling the output of the comparison circuit 10 a plurality of times. Further, in this description, for the sake of convenience in description, voltage is particularly noted as the input signal, but it is apparent that the input signal may be current.

<Application Examples of Zero-Crossing Detection Circuit of Invention>

Figure 8:
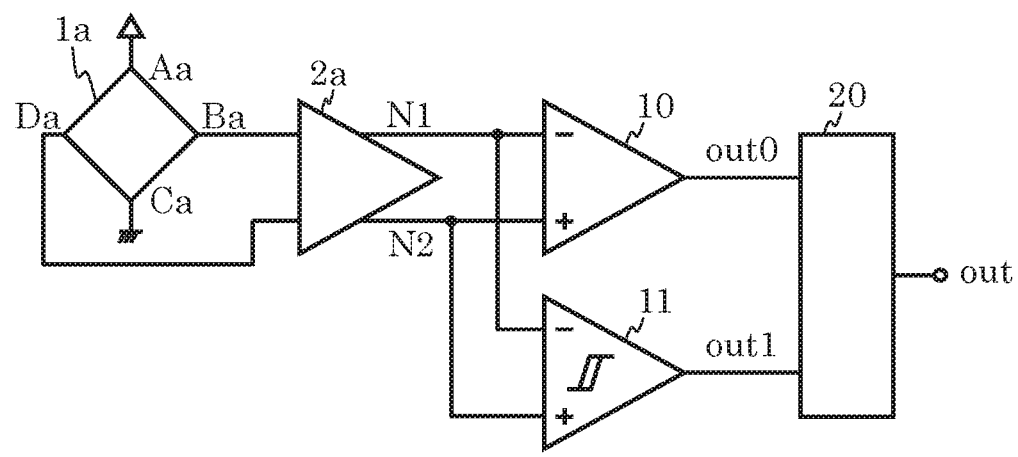
FIG. 8 is a circuit diagram for illustrating a first application example in which the zero-crossing detection circuit according to the first embodiment is applied to a magnetic sensor device.

FIG. 8 is a circuit diagram for illustrating a first application example in which the zero-crossing detection circuit according to the first embodiment of the present invention is applied to a magnetic sensor device. A signal of a Hall element 1a serving as a magnetoelectric conversion element is input to a differential amplifier circuit 2a from a terminal Ba and a terminal Da. The differential amplifier circuit 2a amplifies the signal, and the output of the differential amplifier circuit 2a is connected to the input terminal N1 and the input terminal N2 of the zero-crossing detection circuit of the present invention. In this case, the voltage of the terminal Ba and the voltage of the terminal Da are represented by VBa and VDa, respectively. The signal voltage of the Hall element 1a is represented by VDa−VBa, and an amplification factor of the differential amplifier circuit 2a is represented by G.

The magnitude and the sign of the signal voltage VDa−VBa of the Hall element 1a change based on the direction of the current flowing through the Hall element 1a and the direction of the magnetic field applied thereto in accordance with the Fleming's left-hand rule. When the sign of the signal voltage VDa−VBa is positive in a case where the magnetic field is applied in a direction from the front side to the depth side of the drawing sheet, the sign of the signal voltage VDa−VBa is negative in a case where the magnetic field is applied in a direction from the depth side to the front side of the drawing sheet. Further, as the applied magnetic field is increased, the magnitude of the signal voltage VDa−VBa is increased. Further, in an ideal case where an offset voltage of the Hall element 1a is zero, the signal voltage VDa−VBa is zero when the magnetic field applied to the Hall element 1a is zero. The signal voltage of the Hall element 1a is amplified by the differential amplifier circuit 2a to obtain the following expression.

$$Vn2-Vn1=G\times(VDa-VBa) \quad (1)$$

Thus, Vn2−Vn1 takes a positive value, a negative value, or zero depending on the magnetic field applied to the Hall element 1a. That is, due to the operation of the zero-crossing detection circuit according to the first embodiment of the present invention, the zero-crossing point of the magnetic field applied to the Hall element 1a can be detected with high accuracy without an operation error due to noise. As a different expression, in an application for detecting a relative positional relationship between a magnet and the sensor device having mounted thereon the zero-crossing detection circuit according to the first embodiment of the present invention, a point at which the magnetic field applied to the sensor device is switched from the S-pole to the N-pole or from the N-pole to the S-pole due to the change in relative position can be detected with high accuracy. Thus, the first application example of the present invention is suitable for usage in an encoder or usage in a brushless motor, which requires highly-accurate detection of the rotational position of the rotor. Thus, the demand for high-speed rotation can be met. Further, an output error due to noise, which has been a problem in the related art when meeting the demand of increase in speed, can be prevented, and the rotation can be controlled accurately.

Figure 9:
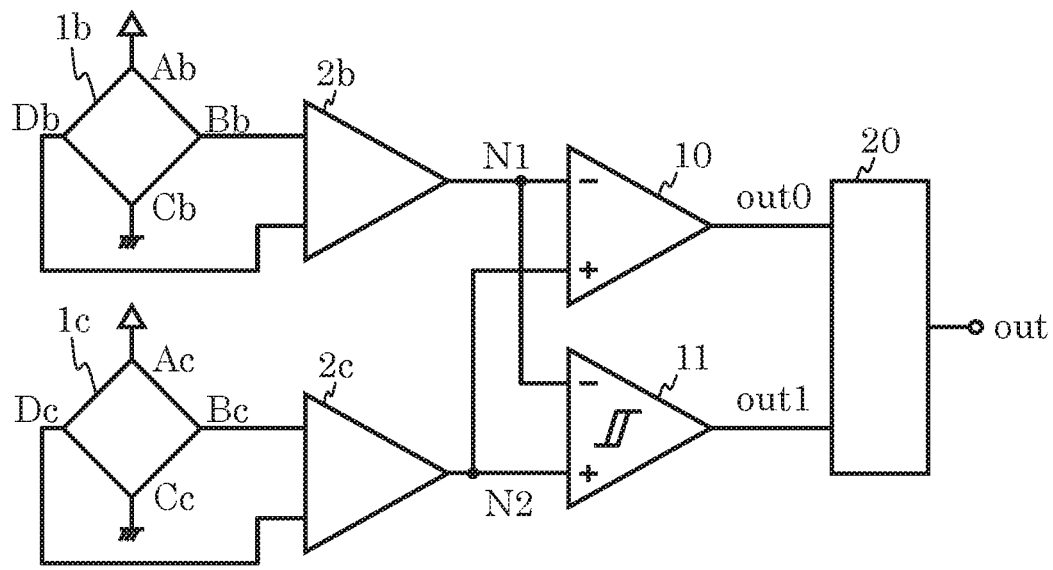
FIG. 9 is a circuit diagram for illustrating a second application example in which the zero-crossing detection circuit according to the first embodiment is applied to the magnetic sensor device.

FIG. 9 is a circuit diagram for illustrating a second application example in which the zero-crossing detection circuit according to the first embodiment of the present invention is applied to the magnetic sensor device. The configuration of connection between a Hall element 1b and a differential amplifier circuit 2b is similar to the configuration of connection between the Hall element 1a and the differential amplifier circuit 2a of the first application example. Further, the configuration of connection between a Hall element 1c and a differential amplifier circuit 2c is also similar to the configuration of connection between the Hall element 1a and the differential amplifier circuit 2a of the first application example. The differential amplifier circuits 2b and 2c have single-ended output as compared to the differential amplifier circuit 2a having differential output. The signal of the Hall element 1b serving as a magnetoelectric conversion element is input to the differential amplifier circuit 2b from a terminal Bb and a terminal Db. The differential amplifier circuit 2b amplifies the signal, and the output of the differential amplifier circuit 2b is connected to the input terminal N1 of the zero-crossing detection circuit of the present invention. Further, the signal of the Hall element 1c serving as a magnetoelectric conversion element is input to the differential amplifier circuit 2c from a terminal Bc and a terminal Dc. The differential amplifier circuit 2c amplifies the signal, and the output of the differential amplifier circuit 2c is connected to the input terminal N2 of the zero-crossing detection circuit of the present invention. In this case, the voltage of the terminal Bb, the voltage of the terminal Db, the voltage of the terminal Bc, and the voltage of the terminal Dc are represented by VBb, VDb, VBc, and VDc, respectively, and the signal voltage of the Hall element 1b and the signal voltage of the Hall element 1c are represented by VDb−VBb and VDc−VBc, respectively. An amplification factor of each of the differential amplifier circuits 2b and 2c is represented by G. In this case, the input voltage Vn1 supplied to the input terminal N1 and the input voltage Vn2 supplied to the input terminal N2 are represented as follows.

$$Vn1=G\times(VDb-VBb) \quad (2)$$

$$Vn2=G\times(VDc-VBc) \quad (3)$$

The following expression is obtained from Expression (2) and Expression (3).

$$Vn2-Vn1=G\times\{(VDc-VBc)-(VDb-VBb)\} \quad (4)$$

Thus, Vn2−Vn1 takes a positive value, a negative value, or zero depending on the magnetic fields applied to the Hall element 1b and the Hall element 1c. That is, due to the operation of the zero-crossing detection circuit according to the first embodiment of the present invention, the zero-crossing point being the difference of the magnetic fields applied to the Hall element 1b and the Hall element 1c can be detected with high accuracy without an operation error due to noise. That is, the zero-crossing detection is output when the signals of the two sensor elements are equal to each other, and the output can be performed while which of the signals of the two sensor elements is larger is determined. The second application example is suitable for an application in which, for example, the magnetic sensor device is arranged between a magnet generating a bias magnetic field and a gear made of a metal, for example, iron or a magnetic material, and the rotation of the gear is detected by the magnetic sensor device.

In this description, for the sake of convenience in description, the differential amplifier circuits 2b and 2c have single-ended output, but the differential amplifier circuits 2b and 2c may have differential output in order to improve the noise resistance. Further, description is given of a case of two Hall elements, but the number of the Hall elements may be larger than two. For example, a differential signal 1 of two Hall elements and a differential signal 2 of two Hall elements different from the above-mentioned Hall elements may be generated, and the zero-crossing of the differential signal 1 and the differential signal 2 may be detected.

Figure 10:
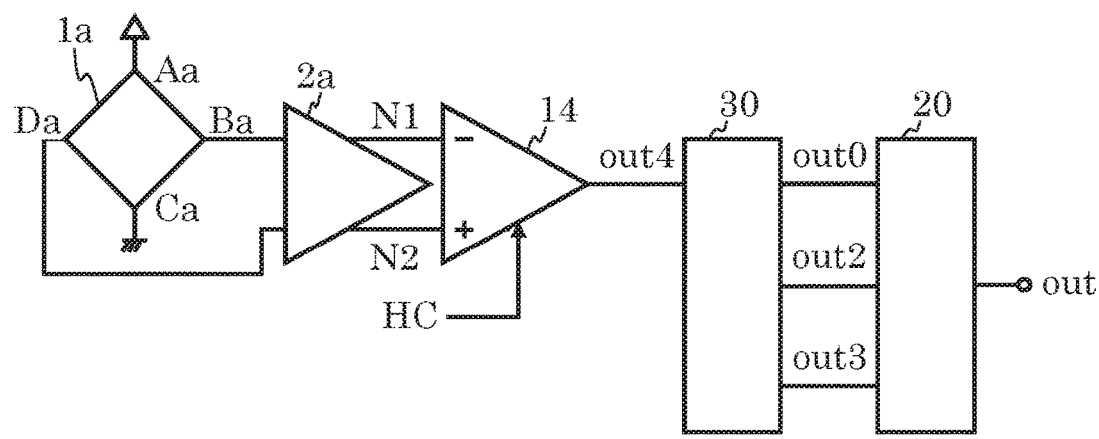
FIG. 10 is a circuit diagram for illustrating a third application example in which the zero-crossing detection circuit according to the second embodiment is applied to the magnetic sensor device.

FIG. 10 is a circuit diagram for illustrating a third application example in which the zero-crossing detection circuit according to the second embodiment of the present invention is applied to the magnetic sensor device. The configuration of connection between the Hall element 1a and the differential amplifier circuit 2a is similar to the configuration of connection between the Hall element 1a and the differential amplifier circuit 2a of the first application example. The signal of the Hall element 1a serving as the magnetoelectric conversion element is input to the differential amplifier circuit 2a from the terminal Ba and the terminal Da. The differential amplifier circuit 2a amplifies the signal, and the output of the differential amplifier circuit 2a is connected to the input terminal N1 and the input terminal N2 of the zero-crossing detection circuit of the present invention. Similarly to the case of the first application example, Vn2−Vn1 takes a positive value, a negative value, or zero depending on the magnetic field applied to the Hall element 1a. That is, due to the operation of the zero-crossing detection circuit according to the second embodiment of the present invention, the zero-crossing point of the magnetic field applied to the Hall element 1a can be detected with high accuracy without an operation error due to noise.

Figure 11:
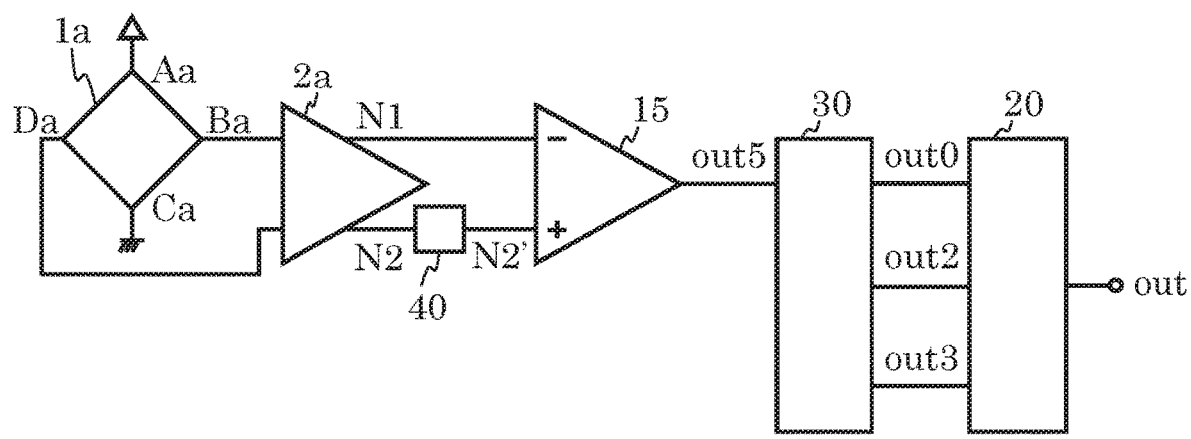
FIG. 11 is a circuit diagram for illustrating a fourth application example in which the zero-crossing detection circuit according to the third embodiment is applied to the magnetic sensor device.
Figure 12:
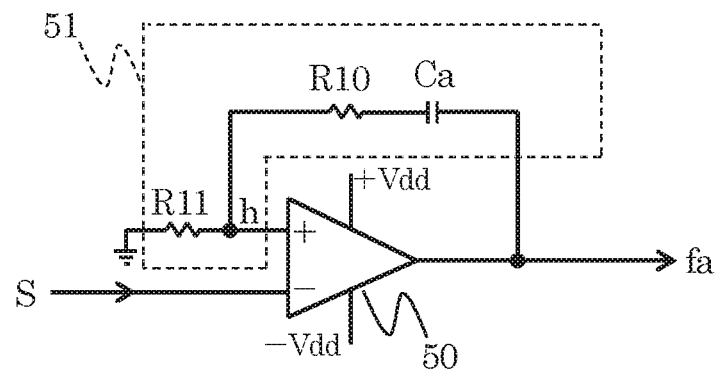
FIG. 12 is a circuit diagram for illustrating a related-art zero-crossing detection circuit.
Figure 13:
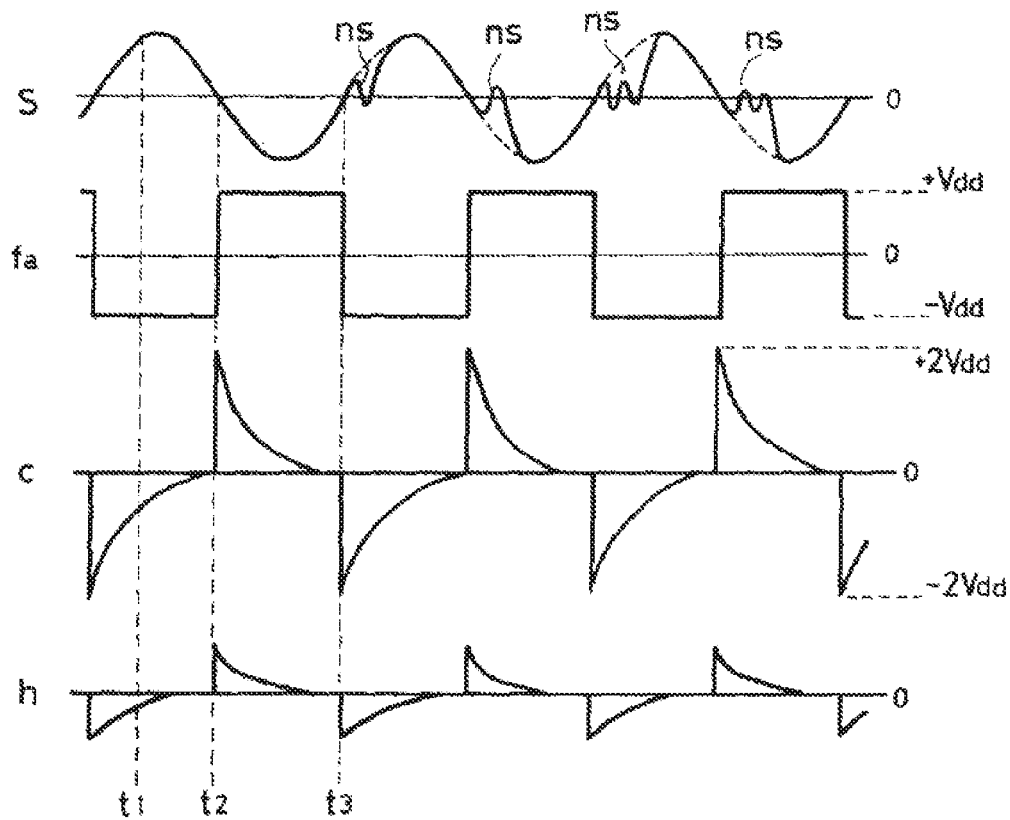
FIG. 13 is a chart for illustrating an operation of the related-art zero-crossing detection circuit.

FIG. 11 is a circuit diagram for illustrating a fourth application example in which the zero-crossing detection circuit according to the third embodiment of the present invention is applied to the magnetic sensor device. The difference from the third application example of FIG. 10 resides in that the third embodiment is applied instead of the second embodiment. Specifically, the comparison circuit 14 is removed to add the comparison circuit 15, and the hysteresis generation circuit 40 is added between the input terminal N2 and the non-inverting input terminal of the comparison circuit 15. The hysteresis control terminal HC of the hysteresis generation circuit 40 is omitted. Other connections and configurations are the same as those of the third application example.

The signal of the Hall element 1a serving as the magnetoelectric conversion element is input to the differential amplifier circuit 2a from the terminal Ba and the terminal Da. The differential amplifier circuit 2a amplifies the signal, and the output of the differential amplifier circuit 2a is connected to the input terminal N1 and the input terminal N2 of the zero-crossing detection circuit of the present invention. Similarly to the cases of the first and second application examples, Vn2−Vn1 takes a positive value, a negative value, or zero depending on the magnetic field applied to the Hall element 1a. That is, due to the operation of the zero-crossing detection circuit according to the third embodiment of the present invention, the zero-crossing point of the magnetic field applied to the Hall element 1a can be detected with high accuracy without an operation error due to noise.

In this description, for the sake of convenience in description, the hysteresis generation circuit 40 is connected between the differential amplifier circuit 2a and the comparison circuit 15, but the hysteresis generation circuit 40 may be connected to a side closer to the signal source. Specifically, the hysteresis generation circuit 40 may be connected between the Hall element 1a and the differential amplifier circuit 2a. In general, the Hall element has a resistance component, and hence the hysteresis generation circuit 40 does not require a resistor. Thus, the hysteresis generation circuit 40 may be formed of only a constant current source and a switching element as an example. In this manner, there are advantages such as contribution to downsizing, and further reduction of characteristic shift due to temperature by synchronizing the value of the constant current with the resistance value of the Hall element.

FIG. 8 to FIG. 11 are examples in which the zero-crossing detection circuit of the present invention is applied to the magnetic sensor device. In this description, specific examples are shown for description. However, the present invention is not necessarily limited to the configuration or the sensor element, and is applicable to various semiconductor circuits and sensor circuits. The same applies to the cases of the zero-crossing detection circuits according to the first, second, and third embodiments. As an example, the zero-crossing detection circuit may be combined with a spinning current circuit configured to cancel an offset voltage that is a non-ideal component of the Hall element serving as the magnetoelectric conversion element, or may be combined with a circuit for a chopping operation or an auto-zero operation, which is configured to cancel an offset voltage that is a non-ideal component of the differential amplifier circuit or the comparison circuit. When the zero-crossing detection circuit is combined with, for example, the spinning current circuit or the circuit for the chopping operation or the auto-zero operation, the signal processing is performed not in a successive time but in a discrete time, and hence it is not preferred to compute the output of each of the comparison circuits 10 to 15 with a combinational circuit for output from the output terminal out. As described with reference to the second or third embodiment, combination with a sequential circuit, for example, a latch circuit, is preferred. Further, the zero-crossing detection circuit may be used for sensor elements such as a temperature sensor element, an acceleration sensor element, and a pressure sensor element other than the magnetoelectric conversion element.

What is claimed is:

1. A zero-crossing detection circuit, comprising:
a comparison circuit configured to receive a first input signal, a second input signal, and a hysteresis control signal as input, wherein a threshold value can be switched to zero, positive, and negative by the hysteresis control signal, and wherein a first comparison result is output when the threshold value is zero, and a second comparison result is output when the threshold value is positive or negative;

a latch circuit configured to receive an output signal at each threshold value of the comparison circuit as input; and a logic circuit configured to receive an output signal of the latch circuit as input, the logic circuit being configured to determine whether to reflect the first comparison result to output of the logic circuit based on the second comparison result.

2. The zero-crossing detection circuit according to claim 1, wherein, under a first condition in which the second comparison result has a first level and the output of the logic circuit has a first output level, transition of the first comparison result from the first level to a second level causes transition of the output of the logic circuit to a second output level, wherein, under a second condition in which the second comparison result has the second level and the output of the logic circuit has the second output level, transition of the first comparison result from the second level to the first level causes transition of the output of the logic circuit to the first output level, and wherein the output of the logic circuit is prevented from being changed under a state other than the first condition and the second condition.

3. The zero-crossing detection circuit according to claim 1, wherein the first input signal and the second input signal comprise voltages.

4. The zero-crossing detection circuit according to claim 1, wherein the first input signal and the second input signal comprise currents.

5. A sensor device, comprising:

a sensor element configured to output a signal based on an intensity of a physical amount applied to the sensor element; and the zero-crossing detection circuit of claim 1, which is configured to detect zero-crossing of the signal output from the sensor element.

6. A zero-crossing detection circuit, comprising:

a comparison circuit configured to receive a first input signal and a second input signal via a hysteresis generation circuit as input, wherein the hysteresis generation circuit switches a threshold value of the comparison circuit between zero, positive, and negative;

a latch circuit configured to receive an output signal at each threshold value of the comparison circuit as input; and a logic circuit configured to receive an output signal of the latch circuit as input, wherein the comparison circuit outputs a first comparison result when the threshold value is zero, and outputs a second comparison result when the threshold value is positive or negative; and wherein the logic circuit is configured to determine whether to reflect the first comparison result to output of the logic circuit based on the second comparison result.

7. A sensor device, comprising:

a sensor element configured to output a signal based on an intensity of a physical amount applied to the sensor element; and the zero-crossing detection circuit of claim 6, which is configured to detect zero-crossing of the signal output from the sensor element.

* * * * *